United States Patent
Chen et al.

(10) Patent No.: US 9,654,088 B2
(45) Date of Patent: May 16, 2017

(54) HYSTERESIS CIRCUIT

(71) Applicant: Taiwan Semiconductor Manufacturing Company, Ltd., Hsin-Chu (TW)

(72) Inventors: Huan-Neng Chen, Taichung (TW); Chewn-Pu Jou, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 100 days.

(21) Appl. No.: 14/290,775

(22) Filed: May 29, 2014

(65) Prior Publication Data
US 2015/0349757 A1 Dec. 3, 2015

(51) Int. Cl.
*H03K 3/00* (2006.01)
*H03K 3/3565* (2006.01)

(52) U.S. Cl.
CPC ................ *H03K 3/3565* (2013.01)

(58) Field of Classification Search
CPC ...... G11C 7/1051; G11C 7/1057; G11C 7/106
See application file for complete search history.

(56) References Cited

U.S. PATENT DOCUMENTS

| | | | | |
|---|---|---|---|---|
| 6,396,610 B1* | 5/2002 | Okayasu | .............. | H03K 17/785 398/140 |
| 6,671,345 B2* | 12/2003 | Vrettos | ................. | A61B 6/032 378/19 |
| 7,518,420 B1* | 4/2009 | Stiff | ...................... | H03L 7/0995 327/156 |
| 2006/0250827 A1* | 11/2006 | Chu | ................. | H02M 3/33507 363/21.12 |

OTHER PUBLICATIONS

Wang, Z. et al., "Novel CMOS Current Schmitt Trigger," Electronics Letters, Nov. 24, 1988, pp. 1514-1516, vol. 24, Issue 24, Institution of Engineering and Technology.

* cited by examiner

*Primary Examiner* — Sibin Chen
(74) *Attorney, Agent, or Firm* — Slater Matsil, LLP

(57) ABSTRACT

A hysteresis circuit includes a current comparator arranged to receive an input current signal. A reference current source is coupled to the current comparator and arranged to provide a reference current. A hysteresis current source is arranged to provide a hysteresis current. A switch is coupled between the reference current source and the hysteresis current source. At least one buffer is coupled to the current comparator and arranged to provide an output voltage signal. The output voltage signal has a first voltage if the input current signal is greater than a sum of the reference current and the hysteresis current and the output voltage signal has a second voltage if the input current signal is less than the reference current.

20 Claims, 8 Drawing Sheets

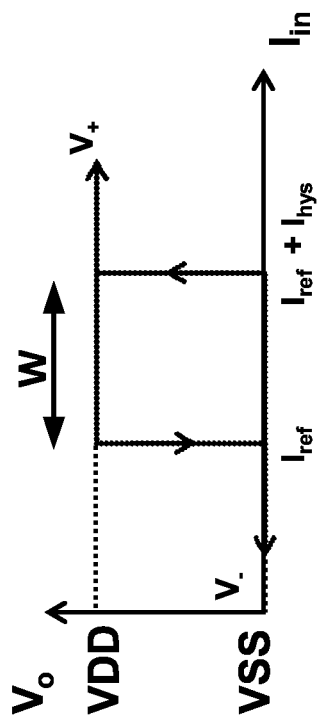
Fig. 2A
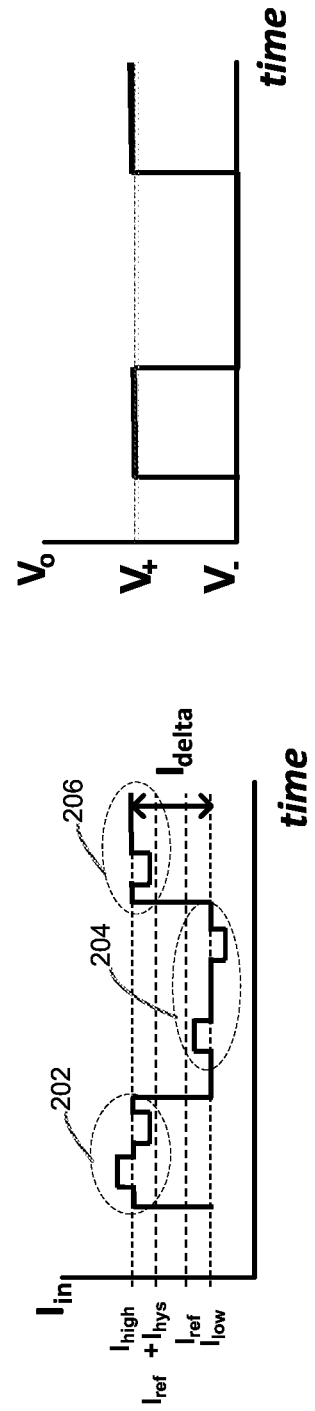
Fig. 2B
Fig. 2C

HYSTERESIS CIRCUIT

BACKGROUND

In some applications, a hysteresis circuit, also known as Schmitt trigger, can be used to convert an analog (or noisy) input signal to a digital output signal. The circuit has an output that retains its value until the input changes sufficiently to trigger a change. In some configurations, when the input is higher than a certain threshold, the output is high. When the input is below a different (lower) threshold, the output is low, and when the input is between the two levels, the output retains its value. This dual threshold action is called hysteresis and a hysteresis circuit can function as a bi-stable circuit such as a latch or a flip-flop.

Hysteresis circuits are typically used in signal conditioning applications to remove noise from signals used in digital circuits. They are also used in closed loop negative feedback configurations to implement relaxation oscillators, and are used in function generators and switching power supplies. A hysteresis circuit with a reliable hysteresis function is desirable.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a plot illustrating hysteresis characteristic of the exemplary hysteresis circuit in FIG. 1A in accordance with some embodiments.

FIG. 2B is an exemplary input current signal of the hysteresis circuit in FIG. 1A in accordance with some embodiments.

FIG. 2C is an exemplary output voltage signal of the hysteresis circuit in FIG. 1A in accordance with some embodiments.

DETAILED DESCRIPTION

Figures 1A, 1B:
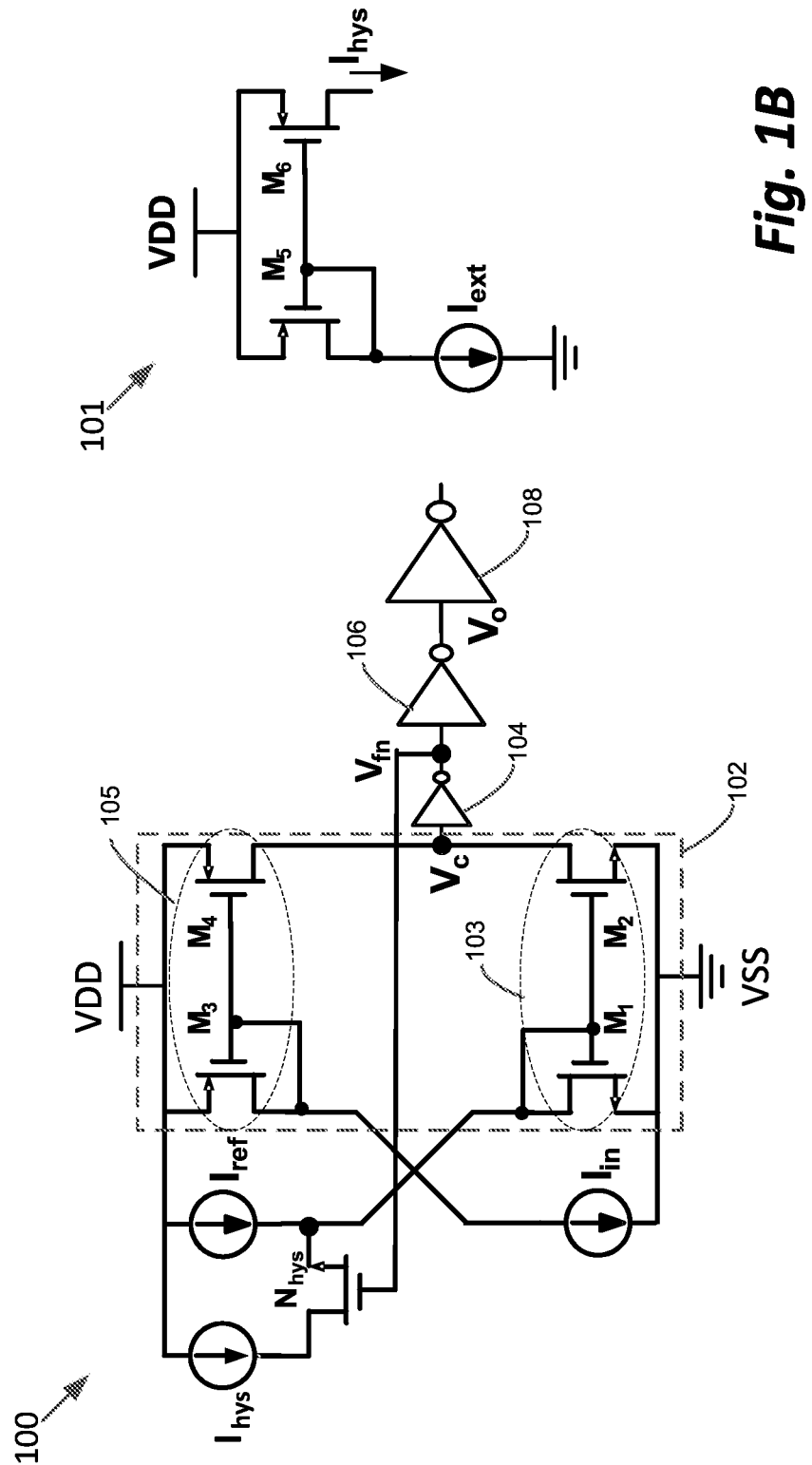
FIG. 1A is an exemplary hysteresis circuit in accordance with some embodiments.
FIG. 1B is an exemplary hysteresis current source in FIG. 1A in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A hysteresis circuit is a circuit used extensively in both analogue and digital circuits. Its main application is to eliminate noise in signal shaping, in on/off control, in relaxation oscillators, and to reduce sensitivity to noise and disturbances. The hysteresis circuit can be a comparator with hysteresis, i.e. exhibiting two different switching voltage levels in its input-output transfer characteristic. For the hysteresis circuit, the input is a current instead of a voltage, which makes the output voltage snap alternately to a logical signal with two stable states ('low' and 'high'), depending on the difference between the input and two threshold currents. Hysteresis circuits are particularly useful in photo-detectors, optical remote controls, and medical instruments. They are of special interest in Complementary Metal-Oxide-Semiconductor (CMOS) technology as interfaces between analogue and digital circuits integrated on a chip.

FIG. 1A is an exemplary hysteresis circuit 100 in accordance with some embodiments. The hysteresis circuit 100 includes a current comparator 102 arranged to receive an input current signal $I_{in}$. The current comparator 102 includes two current mirror circuits in some embodiments. One current mirror circuit includes two NMOS transistors M1 and M2 and another current mirror circuit includes two PMOS transistors M3 and M4.

A reference current $I_{ref}$ is provided by a reference current source coupled to the current comparator 102. A hysteresis current $I_{hys}$ is provided by a hysteresis current source $I_{hys}$ coupled to the reference current source by a switch $N_{hys}$. In this example, the switch $N_{hys}$ is an NMOS transistor. In other embodiments, the switch can be a PMOS transistor, or a pass gate. The switch $N_{hys}$ is coupled between $I_{ref}$ and $I_{hys}$. The hysteresis current $I_{hys}$ is switched to create the hysteresis function. The hysteresis circuit 100 can provide a well-defined hysteresis window by controlling the hysteresis current $I_{hys}$.

At least one buffer such as 104, 106, and 108, are coupled to the current comparator 102 and arranged to provide an output voltage signal Vo in some embodiments. In this example, the buffers are inverters. The number and size of buffers depend on the load coupled to the output, and different embodiments can have different numbers and sizes. In some embodiments, the size of the last buffer 108 in a series of buffers 104, 106, 108 is greater than the first buffer 104. An output $V_{fn}$ from a buffer 104 is feedback and arranged to control the switch $N_{hys}$. In this example, $V_{fn}$ is coupled to the gate of the NMOS transistor $N_{hys}$.

FIG. 1B is an exemplary hysteresis current source in FIG. 1A in accordance with some embodiments. The hysteresis current $I_{hys}$ is provided by a current mirror 101 arranged to receive an external current $I_{ext}$ in some embodiments. In this example, the current mirror 101 includes PMOS transistors M5 and M6. The external current $I_{ext}$ received from outside is duplicated by the current mirror 101 to provide the hysteresis current $I_{hys}$. The hysteresis current $I_{hys}$ can be adjusted or tuned by controlling the external current $I_{ext}$ in some embodiments.

FIG. 2A is a plot illustrating hysteresis characteristic of the exemplary hysteresis circuit in FIG. 1A in accordance with some embodiments. In FIG. 1A, assuming the hysteresis current $I_{hys}$ is not present, the current comparator 102 output voltage Vc is a logical high if $I_{in} > I_{ref}$. In this case, the output voltage $Vo=V_+$ (where $V_+=VDD$). Similarly, assuming the hysteresis current $I_{hys}$ is not present in FIG. 1A, the current comparator 102 output voltage Vc is a logical low, if $I_{in} < I_{ref}$. In this case, the output voltage $Vo=V_-$ (where $V_-=VSS$).

By having the hysteresis current $I_{hys}$ in FIG. 1A, the hysteresis characteristic of FIG. 2A is obtained. For the functional description, the starting point is assumed that $I_{in} < I_{ref} + I_{hys}$ and Vc is a logical low, thus $V_{fn}$ is a logical high to keep the switch $N_{hys}$ closed to connect $I_{ref}$ and $I_{hys}$ for the comparator 102. Under this condition, the output voltage $Vo=V_-$. Now if $I_{in} > I_{ref} + I_{hys}$, the current comparator 102 output voltage Vc is a logical high, thus $V_{fn}$ is a logical low to open the switch $N_{hys}$ to disconnect $I_{hys}$ from $I_{ref}$ for the comparator 102. Hence, the output voltage $Vo=V_+$. If $I_{ref} < I_{in} < I_{ref} + I_{hys}$ when $Vo=V_+$, the output voltage remains $V_+$.

If $I_{in} < I_{ref}$, the current comparator 102 output voltage Vc is a logical low, thus $V_{fn}$ is a logical high to close the switch $N_{hys}$ to connect $I_{ref}$ and $I_{hys}$ for the comparator 102. Under this condition, $Vo=V_-$. Now if $I_{ref} < I_{in} < I_{ref} + I_{hys}$ when $Vo=V_-$, the output voltage remains $V_-$.

The hysteresis window W in FIG. 2A can be adjusted or tuned easily by changing $I_{hys}$. In contrast, in some conventional hysteresis circuits that depend on the geometry of transistors to have a specific hysteresis window, the hysteresis function is not easily tunable after fabrication. Also, the hysteresis circuit 100 operates faster than such conventional hysteresis circuit. In some embodiments, the hysteresis circuit 100 operates at over 8 GHz, while some conventional hysteresis circuits operate up to only 20 MHz.

FIG. 2B is an exemplary input current signal of the hysteresis circuit in FIG. 1A in accordance with some embodiments. The input current signal $I_{in}$ is noisy (or degraded) and the signal level varies from $I_{high}$ and $I_{low}$. The reference current $I_{ref}$ and the hysteresis current $I_{hys}$ are selected so that $I_{ref}$ is higher than the noisy $I_{in}$ around $I_{low}$ and $I_{ref} + I_{hys}$ is lower than the noisy $I_{in}$ around $I_{high}$. The sensitivity of the hysteresis circuit 100 in FIG. 1A can be expressed as the following equation:

$$\text{Sensitivity (\%)} = I_{hys}/(I_{high}-I_{low}) \times 100 = I_{hys}/I_{delta} \times 100 \text{ (\%)}.$$

In some embodiments, the sensitivity ranges from 10% to 90%.

FIG. 2C is an exemplary output voltage signal of the hysteresis circuit 100 in FIG. 1A in accordance with some embodiments. Because of the hysteresis function described above, the noisy input current signal $I_{in}$ in FIG. 2B is cleaned by the hysteresis circuit 100 in FIG. 1A to provide the output voltage signal Vo.

The hysteresis circuit 100 is a high-speed circuit with directly switched hysteresis current $I_{hys}$. In some embodiments, the hysteresis circuit 100 operates at over 8 GHz, while some conventional hysteresis circuits operate up to only 20 MHz. The hysteresis function of the hysteresis circuit 100 is easy to control with a precise hysteresis current $I_{hys}$. In contrast, some conventional hysteresis circuits that depend on the geometry of transistors to have a specific hysteresis window, the hysteresis function is not easily tunable after fabrication and is relatively more subject to process variations.

Figure 3:
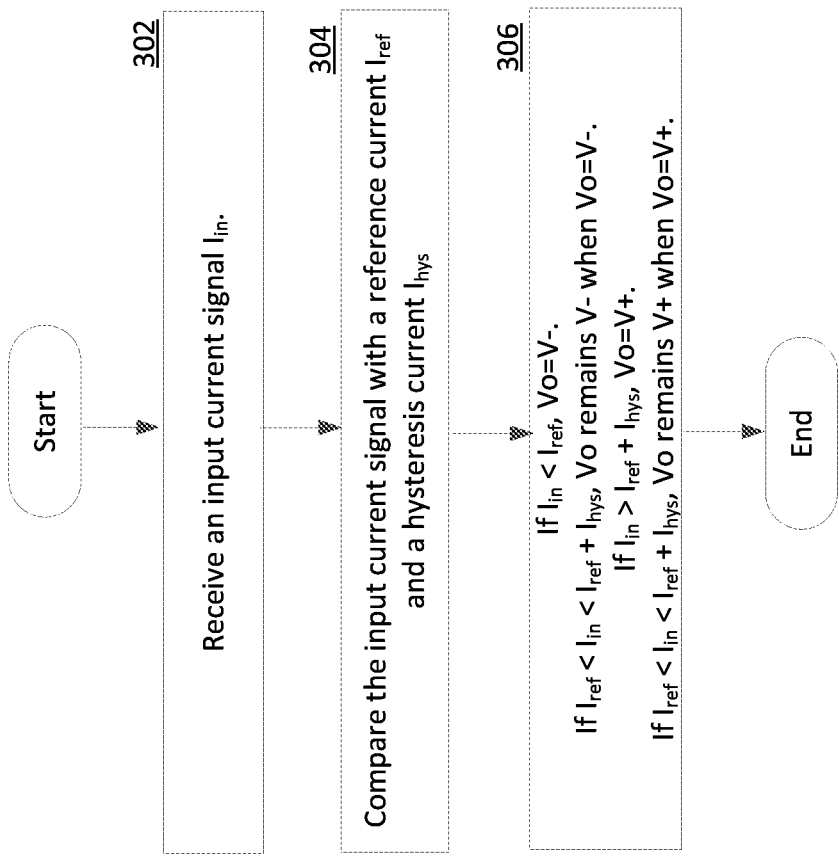
FIG. 3 is an exemplary operational flowchart of the hysteresis circuit in FIG. 1A in accordance with some embodiments.

FIG. 3 is an exemplary operational flowchart of the hysteresis circuit in FIG. 1A in accordance with some embodiments. At step 302, an input current signal $I_{in}$ is received by the hysteresis circuit. At step 304, the input current signal $I_{in}$ is compared with a reference current $I_{ref}$ and a hysteresis current $I_{hys}$. At step 306, an output voltage signal Vo is provided according to the following:

if $I_{in} < I_{ref}$, $Vo=V-$;
if $I_{ref} < I_{in} < I_{ref}+I_{hys}$, Vo remains V− when Vo=V−;
if $I_{in} > I_{ref}+I_{hys}$, $Vo=V+$;
if $I_{ref} < I_{in} < I_{ref}+I_{hys}$, Vo remains V+ when Vo=V+.

In some embodiments, the reference current $I_{ref}$ is provided from a reference current source and the reference current source is a current mirror circuit. In some embodiments, an external current is received and the hysteresis current $I_{hys}$ is provided by a hysteresis current source based on the external current $I_{ext}$, and the hysteresis current source is a current mirror circuit. In some embodiments, there is a switch between the reference current source and the hysteresis current source and the switch is controlled to provide the hysteresis function. In some embodiments, the output voltage signal Vo is provided by at least one buffer and an output from one buffer is arranged to control the switch. In some embodiments, the switch is an NMOS transistor, a PMOS transistor, or a pass gate.

Figure 4:
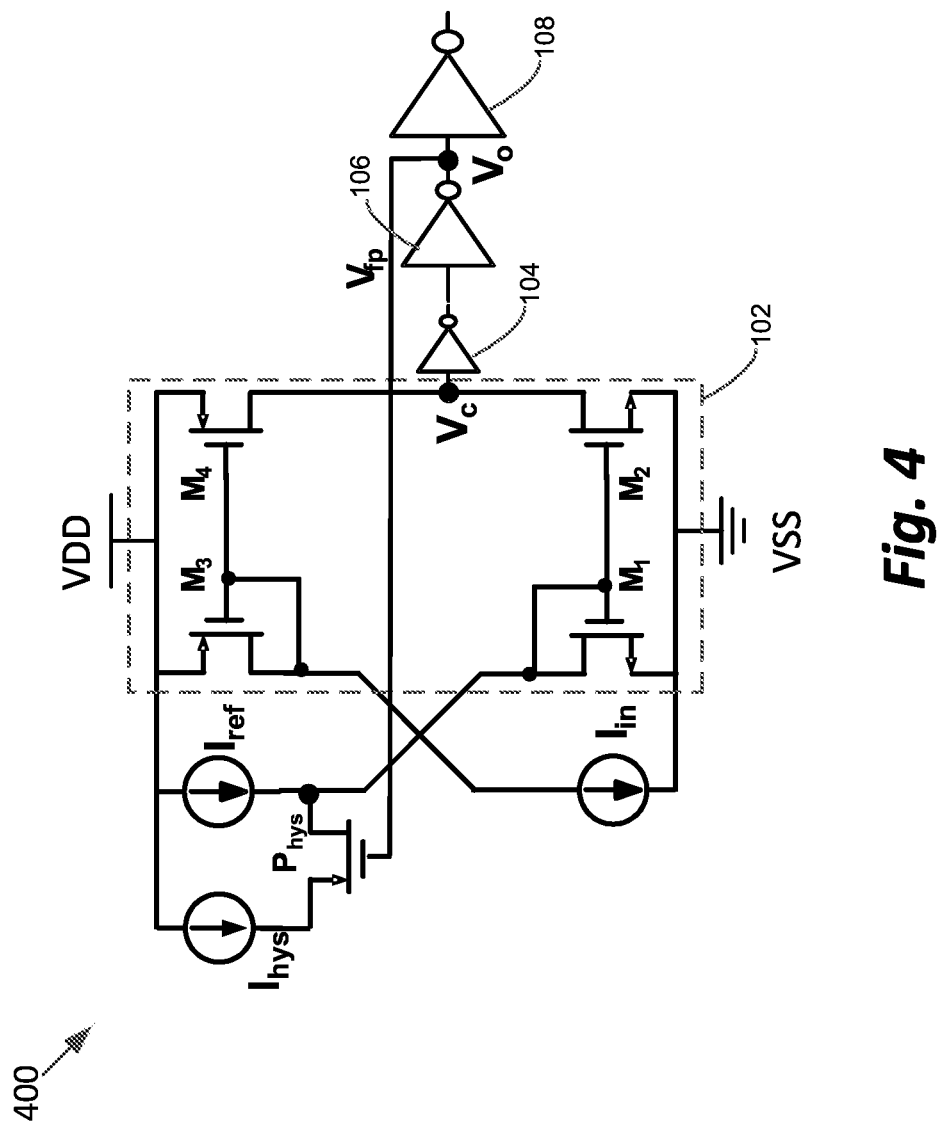
FIG. 4 is another exemplary hysteresis circuit in accordance with some embodiments.

FIG. 4 is another exemplary hysteresis circuit in accordance with some embodiments. The hysteresis circuit 400 includes a current comparator 102 arranged to receive an input current signal $I_{in}$. The current comparator 102 includes two current mirror circuits in some embodiments. One current mirror circuit includes two NMOS transistors M1 and M2 and another current mirror circuit includes two PMOS transistors M3 and M4.

A reference current $I_{ref}$ is provided by a reference current source coupled to the current comparator 102. A hysteresis current $I_{hys}$ is provided by a hysteresis current source $I_{hys}$ coupled to the reference current source by a switch $P_{hys}$. In this example, the switch $P_{hys}$ is a PMOS transistor. The switch $P_{hys}$ is coupled between $I_{ref}$ and $I_{hys}$. The hysteresis current $I_{hys}$ is switched to create the hysteresis function. The hysteresis circuit 400 can provide a well-defined hysteresis window by controlling the hysteresis current $I_{hys}$.

At least one buffer such as 104, 106, and 108, are coupled to the current comparator 102 and arranged to provide an output voltage signal Vo in some embodiments. In this example, the buffers are inverters. The number and size of buffers depend on the load coupled to the output, and different embodiments can have different numbers and sizes. In some embodiments, the size of the last buffer 108 in a series of buffers 104, 106, 108 is greater than the first buffer 104. An output $V_{fp}$ from a buffer 106 is feedback and arranged to control the switch $P_{hys}$. In this example, $V_{fp}$ is coupled to the gate of the PMOS transistor $P_{hys}$.

To describe the operation of the hysteresis circuit 400, the starting point is assumed that $I_{in} < I_{ref}+I_{hys}$ and Vc is a logical low, thus $V_{fp}$ is a logical low to keep the switch $P_{hys}$ closed to connect $I_{ref}$ and $I_{hys}$ for the comparator 102. Under this condition, the output voltage Vo=V−. Now if $I_{in} > I_{ref}+I_{hys}$, the current comparator 102 output voltage Vc is a logical high, thus $V_{fp}$ is a logical high to open the switch $P_{hys}$ to disconnect $I_{hys}$ from $I_{ref}$ for the comparator 102. Hence, the output voltage $Vo=V_+$. If $I_{ref} < I_{in} < I_{ref}+I_{hys}$ when $Vo=V_+$, the output voltage remains $V_+$.

If $I_{in} < I_{ref}$, the current comparator 102 output voltage Vc is a logical low, thus $V_{fp}$ is a logical low to close the switch $P_{hys}$ to connect $I_{ref}$ and $I_{hys}$ for the comparator 102. Under this condition, Vo=V−. Now if $I_{ref} < I_{in} < I_{ref}+I_{hys}$ when $Vo=V_-$, the output voltage remains V_. Therefore, the hysteresis circuit 400 operates according to the hysteresis function shown in FIG. 2A.

Figure 5:
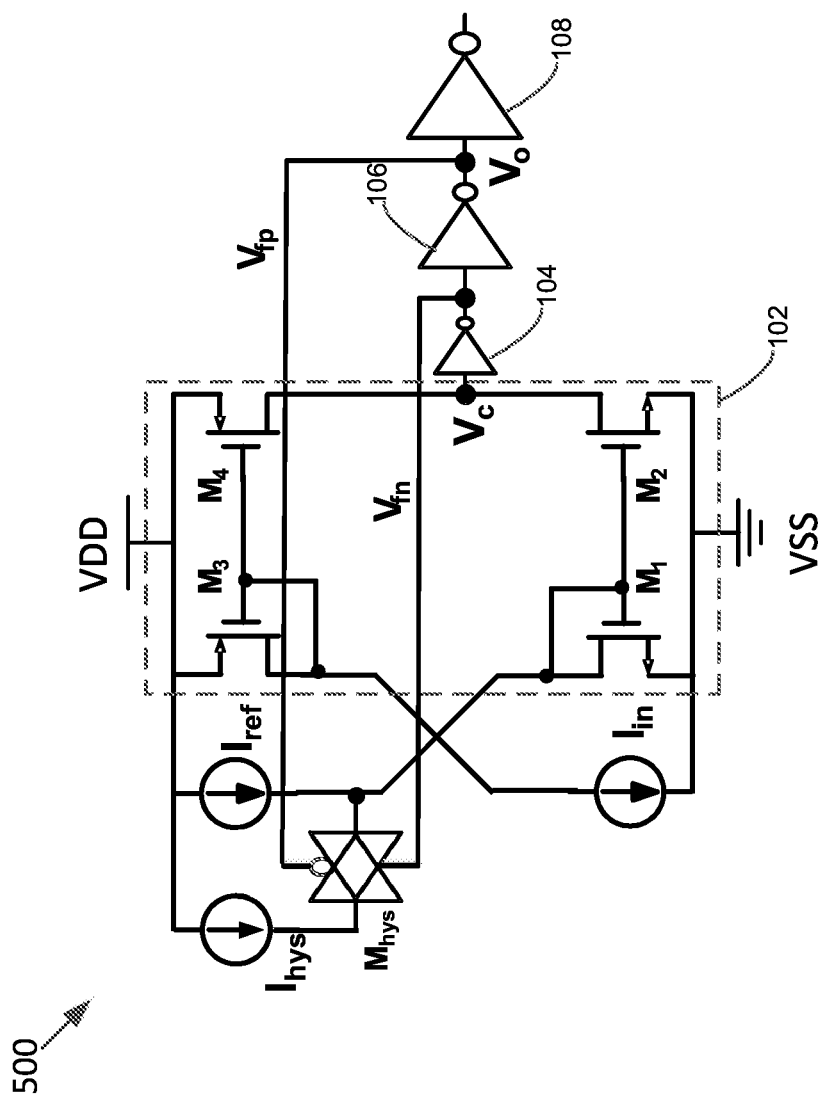
FIG. 5 is yet another exemplary hysteresis circuit in accordance with some embodiments.

FIG. 5 is yet another exemplary hysteresis circuit in accordance with some embodiments. The hysteresis circuit 500 includes a current comparator 102 arranged to receive an input current signal $I_{in}$. The current comparator 102 includes two current mirror circuits in some embodiments. One current mirror circuit includes two NMOS transistors M1 and M2 and another current mirror circuit includes two PMOS transistors M3 and M4.

A reference current $I_{ref}$ is provided by a reference current source coupled to the current comparator 102. A hysteresis current $I_{hys}$ is provided by a hysteresis current source $I_{hys}$ coupled to the reference current source by a switch $M_{hys}$. In this example, the switch $M_{hys}$ is a pass gate. The switch $M_{hys}$ is coupled between $I_{ref}$ and $I_{hys}$. The hysteresis current $I_{hys}$ is switched to create the hysteresis function. The hysteresis circuit 500 can provide a well-defined hysteresis window by controlling the hysteresis current $I_{hys}$.

At least one buffer such as 104, 106, and 108, are coupled to the current comparator 102 and arranged to provide an output voltage signal Vo in some embodiments. In this example, the buffers are inverters. The number and size of buffers depend on the load coupled to the output, and different embodiments can have different numbers and sizes. In some embodiments, the size of the last buffer 108 in a series of buffers 104, 106, 108 is greater than the first buffer 104. Outputs $V_{fp}$ and $V_{fn}$ from the buffers 106 and 104 are feedback respectively and arranged to control the switch $M_{hys}$.

To describe the operation of the hysteresis circuit 500, the starting point is assumed that $I_{in}<I_{ref}+I_{hys}$ and Vc is a logical low, thus $V_{fn}$ is a logical high and $V_{fp}$ is a logical low to keep the switch $M_{hys}$ closed to connect $I_{ref}$ and $I_{hys}$ for the comparator 102. Under this condition, the output voltage Vo=V−. Now if $I_{in}>I_{ref}+I_{hys}$, the current comparator 102 output voltage Vc is a logical high, thus $V_{fn}$ is a logical low and $V_{fp}$ is a logical high to open the switch $M_{hys}$ to disconnect $I_{hys}$ from $I_{ref}$ for the comparator 102. Hence, the output voltage Vo=V+. If $I_{ref}<I_{in}<I_{ref}+I_{hys}$ when Vo=V+, the output voltage remains V+.

If $I_{in}<I_{ref}$, the current comparator 102 output voltage Vc is a logical low, thus $V_{fn}$ is a logical high and $V_{fp}$ if a logical low to close the switch $M_{hys}$ to connect $I_{ref}$ and $I_{hys}$ for the comparator 102. Under this condition, Vo=V−. Now if $I_{ref}<I_{in}<I_{ref}+I_{hys}$ when Vo=V−, the output voltage remains V−. Therefore, the hysteresis circuit 500 operates according to the hysteresis function shown in FIG. 2A.

Figure 6:
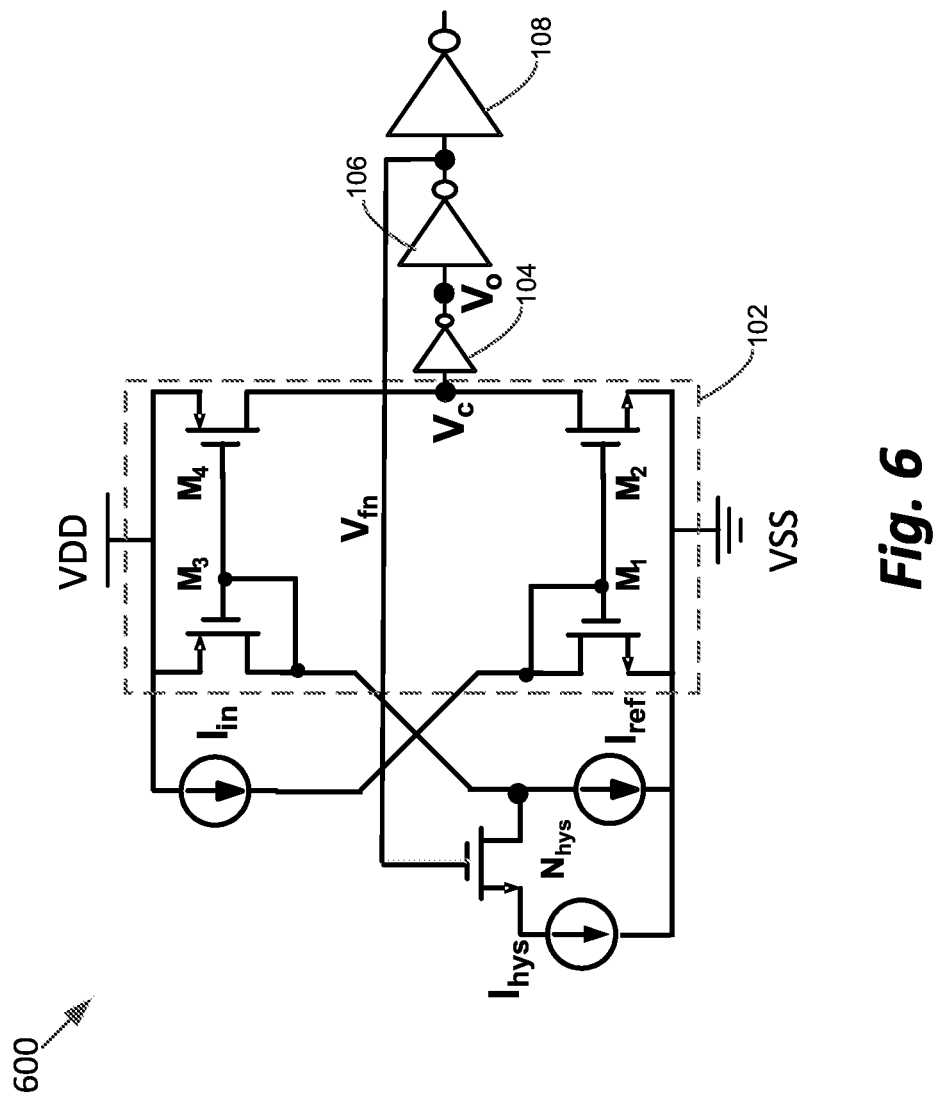
FIG. 6 is yet another exemplary hysteresis circuit in accordance with some embodiments.

FIG. 6 is yet another exemplary hysteresis circuit in accordance with some embodiments. The hysteresis circuit 600 includes a current comparator 102 arranged to receive an input current signal $I_{in}$. The current comparator 102 includes two current mirror circuits in some embodiments. One current mirror circuit includes two NMOS transistors M1 and M2 and another current mirror circuit includes two PMOS transistors M3 and M4.

A reference current $I_{ref}$ is provided by a reference current source coupled to the current comparator 102. A hysteresis current $I_{hys}$ is provided by a hysteresis current source $I_{hys}$ coupled to the reference current source by a switch $N_{hys}$. In this example, the switch $N_{hys}$ is an NMOS transistor. The switch $N_{hys}$ is coupled between $I_{ref}$ and $I_{hys}$. The hysteresis current $I_{hys}$ is switched to create the hysteresis function. The hysteresis circuit 600 can provide a well-defined hysteresis window by controlling the hysteresis current $I_{hys}$.

At least one buffer such as 104, 106, and 108, are coupled to the current comparator 102 and arranged to provide an output voltage signal Vo in some embodiments. In this example, the buffers are inverters. The number and size of buffers depend on the load coupled to the output, and different embodiments can have different numbers and sizes. In some embodiments, the size of the last buffer 108 in a series of buffers 104, 106, 108 is greater than the first buffer 104. An output $V_{fn}$ from a buffer 106 is feedback and arranged to control the switch $N_{hys}$. In this example, $V_{fn}$ is coupled to the gate of the NMOS transistor $N_{hys}$.

If the hysteresis current $I_{hys}$ is not present in FIG. 6, the current comparator 102 output voltage Vc is a logical low, if $I_{in}>I_f$. In this case, the output voltage Vo=V+ (where V+=VDD). Similarly, if the hysteresis current $I_{hys}$ is not present in FIG. 6, the current comparator 102 output voltage Vc is a logical high, if $I_{in}<I_{ref}$. In this case, the output voltage Vo=V− (where V−=VSS).

To describe the operation of the hysteresis circuit 600, the starting point is assumed that $I_{in}<I_{ref}+I_{hys}$ and Vc is a logical high, thus $V_{fn}$ is a logical high to keep the switch $N_{hys}$ closed to connect $I_{ref}$ and $I_{hys}$ for the comparator 102. Under this condition, the output voltage Vo=V−. Now if $I_{in}>I_{ref}+I_{hys}$, the current comparator 102 output voltage Vc is a logical low, thus $V_{fn}$ is a logical low to open the switch $N_{hys}$ to disconnect $I_{hys}$ from $I_{ref}$ for the comparator 102. Hence, the output voltage Vo=V+. If $I_{ref}<I_{in}<I_{ref}+I_{hys}$ when Vo=V+, the output voltage remains V+.

If $I_{in}<I_{ref}$, the current comparator 102 output voltage Vc is a logical high, thus $V_{fn}$ is a logical high to close the switch $N_{hys}$ to connect $I_{ref}$ and $I_{hys}$ for the comparator 102. Under this condition, Vo=V−. Now if $I_{ref}<I_{in}<I_{ref}+I_{hys}$ when Vo=V−, the output voltage remains V−. Therefore, the hysteresis circuit 600 operates according to the hysteresis function shown in FIG. 2A.

Figure 7:
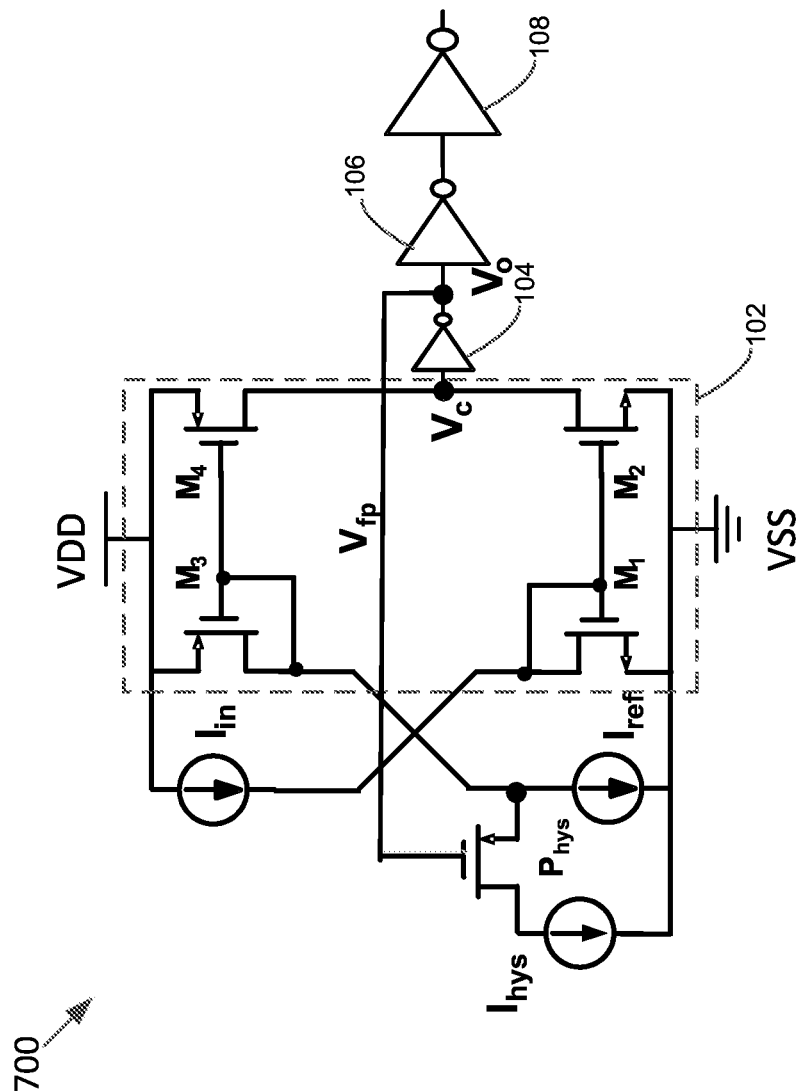
FIG. 7 is yet another exemplary hysteresis circuit in accordance with some embodiments.

FIG. 7 is yet another exemplary hysteresis circuit in accordance with some embodiments. The hysteresis circuit 700 includes a current comparator 102 arranged to receive an input current signal $I_{in}$. The current comparator 102 includes two current mirror circuits in some embodiments. One current mirror circuit includes two NMOS transistors M1 and M2 and another current mirror circuit includes two PMOS transistors M3 and M4.

A reference current $I_{ref}$ is provided by a reference current source coupled to the current comparator 102. A hysteresis current $I_{hys}$ is provided by a hysteresis current source $I_{hys}$ coupled to the reference current source by a switch $P_{hys}$. In this example, the switch $N_{hys}$ is a PMOS transistor. The switch $P_{hys}$ is coupled between $I_{ref}$ and $I_{hys}$. The hysteresis current $I_{hys}$ is switched to create the hysteresis function. The hysteresis circuit 700 can provide a well-defined hysteresis window by controlling the hysteresis current $I_{hys}$.

At least one buffer such as 104, 106, and 108, are coupled to the current comparator 102 and arranged to provide an output voltage signal Vo in some embodiments. In this example, the buffers are inverters. The number and size of buffers depend on the load coupled to the output, and different embodiments can have different numbers and sizes. In some embodiments, the size of the last buffer 108 in a series of buffers 104, 106, 108 is greater than the first buffer 104. An output $V_{fp}$ from a buffer 104 is feedback and arranged to control the switch $P_{hys}$. In this example, $V_{fn}$ is coupled to the gate of the PMOS transistor $P_{hys}$.

To describe the operation of the hysteresis circuit 700, the starting point is assumed that $I_{in}<I_{ref}+I_{hys}$ and Vc is a logical high, thus $V_{fp}$ is a logical low to keep the switch $P_{hys}$ closed to connect $I_{ref}$ and $I_{hys}$ for the comparator 102. Under this condition, the output voltage Vo=V−. Now if $I_{in}>I_{ref}+I_{hys}$, the current comparator 102 output voltage Vc is a logical low, thus $V_{fp}$ is a logical high to open the switch $P_{hys}$ to disconnect $I_{hys}$ from $I_{ref}$ for the comparator 102. Hence, the output voltage Vo=V+. If $I_{ref}<I_{in}<I_{ref}+I_{hys}$ when Vo=V+, the output voltage remains V+.

If $I_{in}<I_{ref}$, the current comparator 102 output voltage Vc is a logical high, thus $V_{fp}$ is a logical low to close the switch $P_{hys}$ to connect $I_{ref}$ and $I_{hys}$ for the comparator 102. Under this condition, Vo=V−. Now if $I_{ref}<I_{in}<I_{ref}+I_{hys}$ when Vo=V−, the output voltage remains V−. Therefore, the hysteresis circuit 700 operates according to the hysteresis function shown in FIG. 2A.

Figure 8:
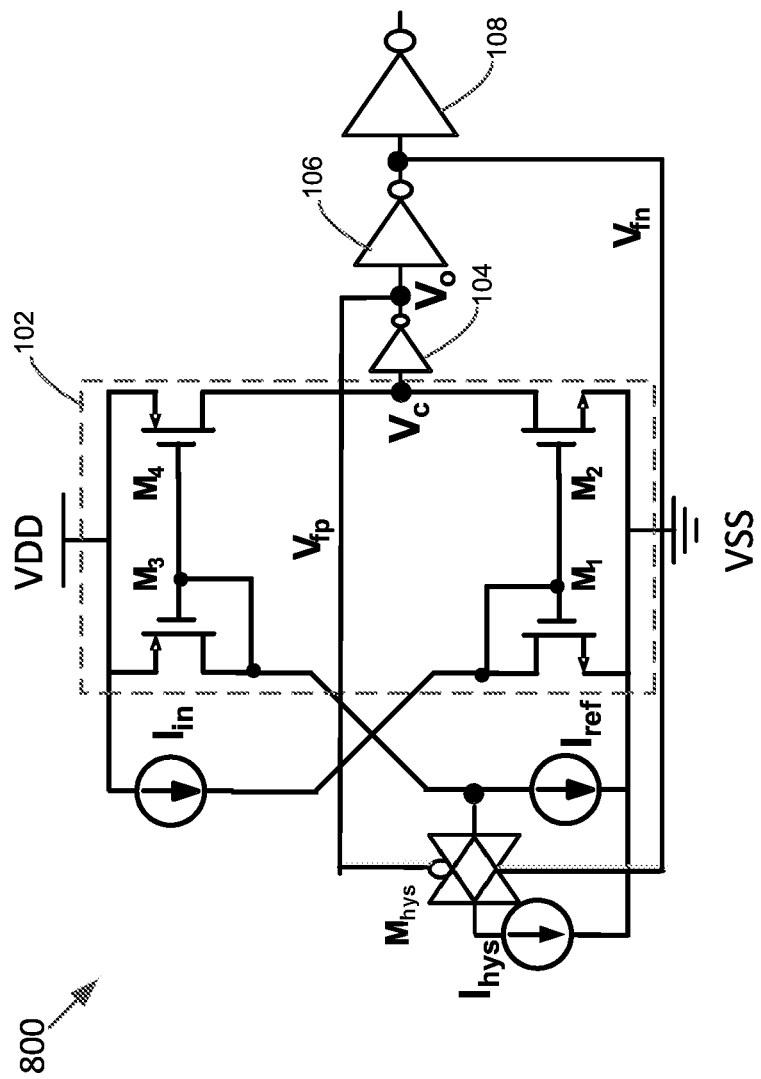
FIG. 8 is yet another exemplary hysteresis circuit in accordance with some embodiments.

FIG. 8 is yet another exemplary hysteresis circuit in accordance with some embodiments. The hysteresis circuit 800 includes a current comparator 102 arranged to receive an input current signal $I_{in}$. The current comparator 102 includes two current mirror circuits in some embodiments. One current mirror circuit includes two NMOS transistors M1 and M2 and another current mirror circuit includes two PMOS transistors M3 and M4.

A reference current $I_{ref}$ is provided by a reference current source coupled to the current comparator 102. A hysteresis current $I_{hys}$ is provided by a hysteresis current source $I_{hys}$ coupled to the reference current source by a switch $M_{hys}$. In this example, the switch $M_{hys}$ is a pass gate. The switch $M_{hys}$ is coupled between $I_{ref}$ and $I_{hys}$. The hysteresis current $I_{hys}$ is switched to create the hysteresis function. The hysteresis circuit 800 can provide a well-defined hysteresis window by controlling the hysteresis current $I_{hys}$.

At least one buffer such as 104, 106, and 108, are coupled to the current comparator 102 and arranged to provide an output voltage signal Vo in some embodiments. In this example, the buffers are inverters. The number and size of buffers depend on the load coupled to the output, and different embodiments can have different numbers and sizes. In some embodiments, the size of the last buffer 108 in a series of buffers 104, 106, 108 is greater than the first buffer 104. Outputs $V_{fp}$ and $V_{fn}$ from the buffers 104 and 106 are feedback respectively and arranged to control the switch $M_{hys}$.

To describe the operation of the hysteresis circuit 800, the starting point is assumed that $I_{in}<I_{ref}+I_{hys}$ and Vc is a logical high, thus $V_{fn}$ is a logical high and $V_{fp}$ is a logical low to keep the switch $M_{hys}$ closed to connect $I_{ref}$ and $I_{hys}$ for the comparator 102. Under this condition, the output voltage Vo=V−. Now if $I_{in}>I_{ref}+I_{hys}$, the current comparator 102 output voltage Vc is a logical low, thus $V_{fn}$ is a logical low and $V_{fp}$ is a logical high to open the switch $M_{hys}$ to disconnect $I_{hys}$ from $I_{ref}$ for the comparator 102. Hence, the output voltage Vo=V+. If $I_{ref}<I_{in}<I_{ref}+I_{hys}$ when Vo=V+, the output voltage remains V+.

If $I_{in}<I_{ref}$, the current comparator 102 output voltage Vc is a logical high, thus $V_{fn}$ is a logical high and $V_{fp}$ if a logical low to close the switch $M_{hys}$ to connect $I_{ref}$ and $I_{hys}$ for the comparator 102. Under this condition, Vo=V−. Now if $I_{ref}<I_{in}<I_{ref}+I_{hys}$ when Vo=V−, the output voltage remains V−. Therefore, the hysteresis circuit 800 operates according to the hysteresis function shown in FIG. 2A.

According to some embodiments, a hysteresis circuit includes a current comparator arranged to receive an input current signal. A reference current source is coupled to the current comparator and arranged to provide a reference current. A hysteresis current source is arranged to provide a hysteresis current. A switch is coupled between the reference current source and the hysteresis current source. At least one buffer is coupled to the current comparator and arranged to provide an output voltage signal. The output voltage signal has a first voltage if the input current signal is greater than a sum of the reference current and the hysteresis current and the output voltage signal has a second voltage if the input current signal is less than the reference current.

According to some embodiments, a method of operating a hysteresis circuit includes receiving an input current signal. The input current signal is compared with a reference current and a hysteresis current. A first voltage is provided as an output voltage signal if the input current signal is greater than a sum of the reference current and the hysteresis current. A second voltage is provided as an output voltage signal if the input current signal is less than the reference current.

According to some embodiments, a hysteresis circuit includes a current comparator arranged to receive an input current signal. A reference current source is coupled to the current comparator and arranged to provide a reference current. A hysteresis current source is arranged to provide a hysteresis current. A switch is coupled between the reference current source and the hysteresis current source. At least one buffer is coupled to the current comparator and arranged to provide an output voltage signal. The output voltage signal has a first voltage if the input current signal is greater than a sum of the reference current and the hysteresis current and the output voltage signal has a second voltage if the input current signal is less than the reference current. The output voltage signal remains the first voltage if the input current signal is between the reference current and the sum of the reference current and the hysteresis current when the output voltage signal has the first voltage, and the output voltage signal remains the second voltage if the input current signal is between the reference current and the sum of the reference current and the hysteresis current when the output voltage signal has the second voltage The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A hysteresis circuit, comprising:
   a current comparator having a first input node coupled to an input current signal;
   a reference current source coupled to a second input node of the current comparator;
   a hysteresis current source;
   a switch coupled between the reference current source and the hysteresis current source; and
   at least one buffer, a first buffer of the at least one buffer having an input node coupled to an output node of the current comparator, wherein the output node and the second input node are different nodes of the current comparator;
   wherein the at least one buffer provides an output voltage signal that has a first voltage in response to the input current signal being greater than a sum of a reference current from the reference current source and a hysteresis current from the hysteresis current source, and the output voltage signal has a second voltage, different from the first voltage, in response to the input current signal being less than the reference current.

2. The circuit of claim 1, wherein the hysteresis current source is a current mirror circuit arranged to receive an external current.

3. The circuit of claim 1, wherein the current comparator comprises two current mirror circuits.

4. The circuit of claim 3, wherein a first current mirror circuit comprises two PMOS transistors and a second current mirror circuit comprises two NMOS transistors.

5. The circuit of claim 1, wherein the at least one buffer comprises at least one inverter.

6. The circuit of claim 1, wherein an output from one buffer of the at least one buffer is coupled to a control terminal of the switch.

7. The circuit of claim 1, wherein the switch is an NMOS transistor, a PMOS transistor, or a pass gate.

8. The circuit of claim 1, wherein, when the output voltage signal has the first voltage, the output voltage signal remains at the first voltage as long as the input current signal remains between the reference current and the sum of the reference current and the hysteresis current.

9. The circuit of claim 8, wherein, when the output voltage signal has the second voltage, the output voltage signal remains at the second voltage as long as the input current signal is between the reference current and the sum of the reference current and the hysteresis current.

10. The circuit of claim 1, wherein the first voltage is greater than the second voltage.

11. A method of operating a hysteresis circuit, comprising:
receiving an input current signal;
receiving an external current from an external current source;
mirroring, by a current mirror of a hysteresis current source, the external current to generate a hysteresis current, wherein the external current source is coupled between the current mirror of the hysteresis current source and a ground terminal;
comparing the input current signal with a reference current and the hysteresis current;
providing a first voltage as an output voltage signal in response to the input current signal being greater than a sum of the reference current and the hysteresis current; and
providing a second voltage as an output voltage signal in response to the input current signal is less than the reference current.

12. The method of claim 11, further comprising maintaining the first voltage as the output voltage signal as long as the input current signal is between the reference current and the sum of the reference current and the hysteresis current.

13. The method of claim 12, further comprising maintaining the second voltage as the output voltage signal as long as the input current signal is between the reference current and the sum of the reference current and the hysteresis current.

14. The method of claim 11, further comprising providing the reference current from a reference current source.

15. The method of claim n claim 11, further comprising feeding back the output voltage signal to control a switch coupled to the hysteresis current source.

16. The method of claim 15, wherein the output voltage signal is provided by at least one buffer and an output from one buffer of the at least one buffer is arranged to control the switch.

17. The method of claim 16, wherein the switch is an NMOS transistor, a PMOS transistor, or a pass gate.

18. A hysteresis circuit, comprising:
a current comparator arranged to receive an input current signal, wherein the current comparator comprises:
a first current mirror comprising a first transistor and a second transistor; and
a second current mirror comprising a third transistor and a fourth transistor, the input current signal being received from an input current source that is connected to a drain terminal of the first transistor and directly connected to a ground terminal;
a reference current source coupled to the current comparator and arranged to provide a reference current;
a hysteresis current source arranged to provide a hysteresis current;
a switch coupled between the reference current source and the hysteresis current source; and
at least one buffer coupled to the current comparator and arranged to provide an output voltage signal, the at least one buffer being coupled to the current comparator between the first current mirror and the second current mirror;
wherein the output voltage signal has a first voltage in response to the input current signal being greater than a sum of the reference current and the hysteresis current, the output voltage signal has a second voltage in response to the input current signal being less than the reference current, the output voltage signal remains the first voltage in response to the input current signal being between the reference current and the sum of the reference current and the hysteresis current when the output voltage signal has the first voltage, and the output voltage signal remains the second voltage in response to the input current signal being between the reference current and the sum of the reference current and the hysteresis current when the output voltage signal has the second voltage.

19. The hysteresis circuit of claim 18, wherein a first node of the hysteresis current source is directly coupled to a supply voltage.

20. The hysteresis circuit of claim 18, wherein a first node of the reference current source is directly coupled to a supply voltage.

* * * * *